United States Patent [19]

Dieterle

[11] 4,291,359

[45] Sep. 22, 1981

[54] SAFETY CIRCUIT FOR A POTENTIALLY DANGEROUS MACHINE MONITORED BY LIGHT

[75] Inventor: Gerhard Dieterle, Gutach, Fed. Rep. of Germany

[73] Assignee: Erwin Sick GmbH Optik-Elektronik, Waldkirch, Fed. Rep. of Germany

[21] Appl. No.: 53,242

[22] Filed: Jun. 29, 1979

[30] Foreign Application Priority Data

Jul. 14, 1978 [DE] Fed. Rep. of Germany ....... 2831089

[51] Int. Cl.³ ...................... G01R 31/00; H01H 49/00

[52] U.S. Cl. .................................... 361/173; 361/192; 307/326; 100/53

[58] Field of Search ....................... 361/173, 191, 192; 192/129 A; 100/53; 307/326

[56] References Cited

U.S. PATENT DOCUMENTS

| | | | |
|---|---|---|---|
| 2,241,556 | 5/1941 | MacMillin et al. | 192/130 |
| 3,858,095 | 12/1974 | Friemann et al. | 361/173 |
| 3,866,004 | 2/1975 | Nawrocki | 100/53 X |
| 3,911,344 | 10/1975 | Svenson | 361/173 X |
| 3,950,755 | 4/1976 | Westbrook et al. | 100/53 |
| 4,072,222 | 2/1978 | Coon | 100/53 X |

FOREIGN PATENT DOCUMENTS

| | | | |
|---|---|---|---|
| 1106404 | 5/1961 | Fed. Rep. of Germany | 361/173 |
| 1121180 | 1/1962 | Fed. Rep. of Germany . | |
| 1924461 | 11/1970 | Fed. Rep. of Germany . | |
| 1463215 | 12/1970 | Fed. Rep. of Germany . | |
| 2038079 | 2/1972 | Fed. Rep. of Germany . | |
| 2305090 | 8/1974 | Fed. Rep. of Germany . | |
| 2128090 | 10/1972 | France . | |
| 74708 | 7/1970 | German Democratic Rep. . | |
| 86525 | 12/1971 | German Democratic Rep. . | |
| 905848 | 9/1962 | United Kingdom | 192/129 A |
| 1218412 | 1/1971 | United Kingdom . | |

*Primary Examiner*—J. D. Miller
*Assistant Examiner*—L. C. Schroeder

[57] ABSTRACT

A safety circuit for a potentially dangerous machine monitored by light and which works in an operating cycle. A safety circuit is described which utilizes a series of relays each of which is switched from an energized to a de-energized condition once during each working cycle of the machine so that each of the relay contact also opens and closes during the working cycle. In this way each relay contact is tested. The relays are so interconnected that if one contact should stick it will interrupt the sequence and will ensure the potentially dangerous machine e.g. a press is rendered inactive. Circuits are given for both hand fed and automatic machines which are monitored by a light barrier or curtain. For the hand fed machine the cycle is initiated by the operator reaching through the light barrier to insert an object into the machine. For an automatically fed machine the test cycle is initiated by a switch automatically activated once per cycle.

7 Claims, 4 Drawing Figures

SAFETY CIRCUIT FOR A POTENTIALLY DANGEROUS MACHINE MONITORED BY LIGHT

Figure 1:
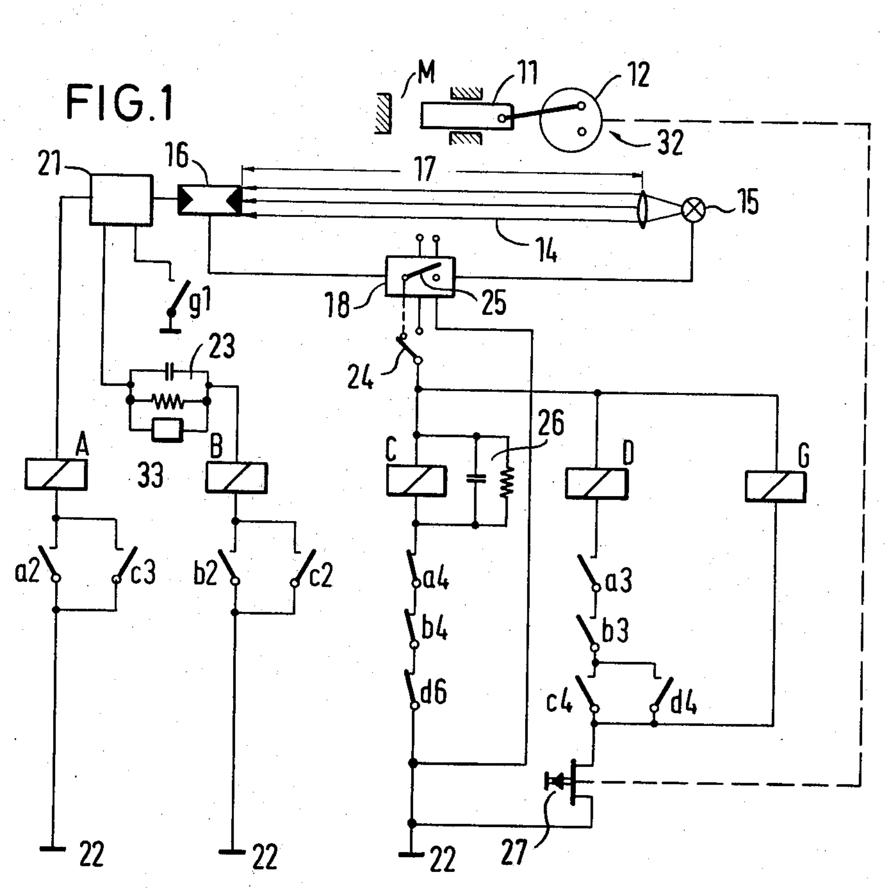

The present invention relates to a safety circuit for a potentially dangerous machine monitored by light, especially a machine which operates in a cycle between a dangerous position and a non-dangerous position and which is made safe by a light barrier or light curtain against intervention, the safety circuit including a first main relay which is energised when the region being monitored is free and which has a make contact located in the drive circuit of the machine.

Machines of this kind include, amongst other things, presses in which the objects to be pressed are introduced either by hand or automatically, During introduction of the object by hand the press automatically remains in its upper inoperative position whilst the operator intervenes by reaching into the zone of potential danger of the machine through the region monitored by the light to locate the object to be pressed. During this period the press must not under any circumstances be capable of being set into operation. Apart from this the safety circuit which is initiated by interruption of the light beam or curtain must operate so that the machine is at once stopped if intervention in the region monitored by the light beam or curtain takes place during operation of the press.

After introduction of an object a working cycle of the press is initiated by hand by the operator which is only possible when no obstacle is located in the region monitored by the light curtain or barrier.

For presses which are automatically fed the press spends practically no time in its upper inoperative position but rather a continuous up and down movement of the press tool takes place. In this case however a light curtain must protect against intervention in dangerous regions of the machine.

The various switching processes in potentially dangerous machines of this kind are conventionally initiated by a number of relays. Particularly important are those relays which have contacts located in the working circuit of the potentially dangerous machine as these contacts must be interrupted without fail if dangers to the operator are to be avoided on intervention in the monitored region.

It can happen that the make or break contacts of relays, especially after a long period of continuous operation jam or stick, for example become welded together, so that on activation, or deactivation, of the relevant relay the required interruption brought about by the switching procedure no longer takes place. If the associated seized contact lies in the operating circuit of the potentially dangerous machine then the machine cannot be switched off despite intervention in the monitored region and this can lead to a situation of considerable danger.

The object of the invention resides in providing a safety circuit of the kind previously described in which all the contacts, and in particular those make and break contacts located in the operating circuit of the potentially dangerous machine, are checked for their functional ability during the sequence of the working cycle of the machine, in particular when the machine is a press.

The invention is characterized by the following features:

(a) a second main relay is connected in parallel with the first main relay, (b) a first monitoring relay is connected in series with break contacts of the first and second main relays and of a second monitoring relay, the first monitoring relay having drop out delay means and two make contacts respectively connected in series with respective ones of the first and second main relays, (c) the make contacts of the first and second main relays and the first monitoring relay are connected in series with the second monitoring relay and a self holding contact of the second monitoring relay is connected in parallel with the make contact of the first monitoring relay, (d) self holding contacts of the two main relays are respectively connected in parallel with the make contacts of the first monitoring relay which are in series with the first and second main relays.

(e) at least one break contact of the first monitoring relay and a make contact of the second monitoring relay are connected in series in the drive circuit for the machine and (f) the first and second main relays and the first and second monitoring relays have compulsorily guided contacts.

The thought underlying the invention is thus that the contacts of the individual relays are so connected that all relay contacts are tested for a faulty condition for each intervention in the region monitored by the light curtain or the light barrier whilst the machine is in its upper inoperative position. Should one of the contacts stick then the machine can no longer be set in operation so that not only is an immediate indication of this fact available but also a situation of danger can be avoided with certainty.

By the term "compulsorily guided (or sequence controlled) contacts" in connection with a relay one understands that a stuck make contact, following deactivation of the relay, may still allow the opening of other closed make contacts but must however prevent any break contact of the same relay from closing. If, in distinction, a break contact sticks then, on activation of the relay, the other break contacts may still open however any make contact is not allowed to close. The use of the relays of this type is basic to the present invention.

By the term "make contact" one understands a contact which is normally open when the relay is deenergised but which closes (makes) when the relay is energised. Similarly a break contact is one which is normally closed when the relay is deenergised but which opens (breaks) when the relay is energised. The term "self holding contact" is customarily applied to a contact which is connected to the energising winding of the relay and to a source of electrical energy so that after the relay has been energised, by for example a pulse signal, the contact closes and maintains the relay in an energised condition until the power from the energising source is for some reason interrupted.

The subject of the invention is thus a safety circuit for relays in which all the inbuilt relays must follow a sequence program determined by the interconnection of the contacts of these relays and which is initiated by an operating signal initiated by hand, or automatically and which is introduced via an opto-electronic controller/-signaller. It is important that each relay must take on both operating conditions "open" and "closed" during an operating cycle of this kind and that relays with compulsorily guided contacts are used.

The degree of safety is further increased in that, apart from the main contact which is located in the drive circuit of the machine and which belongs to the first main relay, a second make contact of the second main relay is also connected in series in the drive circuit of the machine.

For hand operated machines, the monitoring cycle is automatically initiated each time the operator makes the cyclically required intervention into the machine and thus interrupts the light curtain (or the light barrier). For automatic machines, for example presses that are fed automatically with objects to be processed, the cyclic functional testing of the relay contacts take place automatically. For this purpose a specially preferred embodiment of the invention is provided which is characterized in that a contact of a further relay is inserted between the first and second main relays and an opto-electronic signaller which actuates the main relays, there being a switch in the energising circuit for the further relay which is also connected in series with the second monitoring relay and which is open when the machine is in a non-dangerous condition but is otherwise closed.

The relevant switch thus simultates a periodic interruption of the light curtain or barrier.

The degree of safety offered by the circuit is further increased in that the relay contacts arranged in the drive circuit of the driving machine are connected in series in the current circuits of interlocks the make contacts of which are located in the machine control circuit. Preferably the make contacts of two interlocks are connected in series in the control circuit of the machine, and a break contact of the first monitoring relay and a make contact of the second monitoring relay together with a make contact of the first main relay and/or of the second main relay are respectively connected in series in the current circuits of the two interlocks.

A further modification of the invention, which once more increases the degree of safety, is characterized in that, in addition, a break contact of a second additional relay is arranged in series in the machine control circuit with a break contact of the second monitoring relay arranged in the energising circuit for the second additional relay.

In accordance with a generalized aspect of the invention there is provided a safety circuit for a potentially dangerous machine monitored by light, especially a machine which operates in a cycle between a dangerous position and a non-dangerous position and which is made safe by a light barrier or light curtain against intervention, the safety circuit including a first main relay which is energised when the region being monitored is free and which has a make contact located in the drive circuit of the machine, the safety circuit being characterized in that a test circuit is provided including a series of further relays each having a plurality of comulsorily guided contacts at least one of each of which is disposed in the energising circuit of at least one of the other relays whereby, during one working cycle of the machine, each relay is switched at least once from an energised to a deenergised condition whereby all relay contacts are switched in sequence at least once from an open to a closed position and wherein the interconnection of the relay contacts prevents a further cycle of machine operation if said sequence is interrupted due to one of the following causes:

(a) any relay contact sticking and (b) untimely intervention in the monitoring light barrier.

Figure 2:
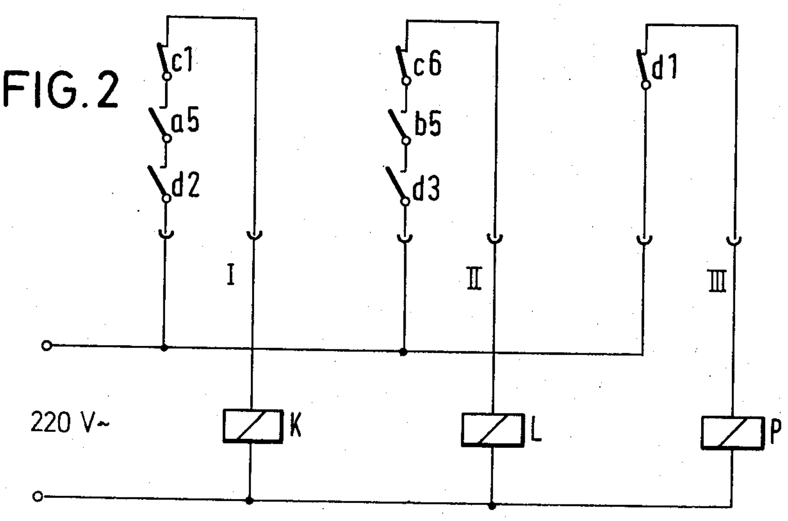
Figure 3:
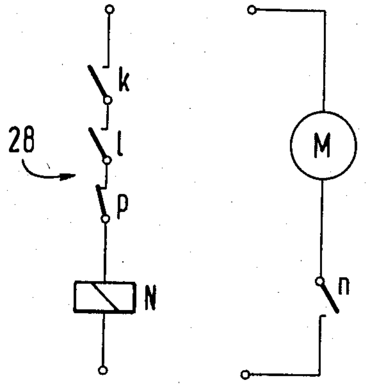
Figure 4:
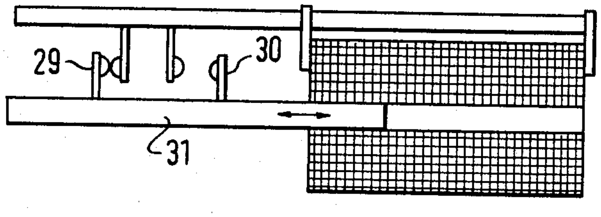

The invention will now be further explained by way of example only and with reference to the accompanying drawings which show:

FIG. 1 a schematic block circuit diagram of a safety circuit in accordance with the present teaching showing the interconnection of the relays, FIG. 2 a block circuit diagram of an especially preferred drive control circuit associated with the safety circuit of FIG. 1, FIG. 3 a block circuit diagram of a preferred machine control circuit which is controlled using the drive control circuit of FIG. 2 and FIG. 4 a schematic illustration of a simple relay with compulsorily guided contacts such as is necessary for the purposes of the invention.

Referring firstly to FIG. 1 there can be seen in schematic form a press generally indicated at 11 in which the press tool 11 is guided for reciprocating movement and is driven by a wheel 12. In order to prevent an operator from reaching into the operating region of the press and sustaining injury the entrance to the press is monitored in conventional fashion by a light curtain 14 which is generated by a light transmitter 15 and directed toward a light receiver 16 through a region 17 hereafter referred to as the monitored region.

In known fashion a power supply 18 receives power at its input terminals 19 and 20 from a main supply and produces suitable voltages for energising the light transmitter and the light receiver 16. A power supply of this kind is wellknown in the art and will therefore not be described in further detail. An opto-electric signaller/-controller 21 which is likewise wellknown in the art detects the output from the light receiver 16 and in its basic form produces a constant output voltage when the light barrier, in this case the light curtain 14, is unbroken and substantially no output voltage when the light barrier is interrupted. In the usual way the opto-electronic signaller 21 contains various subcircuits for, for example, distinguishing between light from the light transmitter 15 and light from stray light sources, for compensating for the presence of background light, and further compensating circuits for such eventualities as ageing of the lamp of the light transmitter 15 and dirtying of the optics. These subcircuits are not material to the present invention and will thus not be described in further detail.

A number of relays A, B, C, D and G are connected between the common earth 22 and the opto-electronic signaller 21 and the power supply 18. The function of these relays, which will be later explained in more detail, is to control the sequence of events leading up to energising of the drive to the press 10 and to prevent actuation of this drive unless, as a result of the prescribed safety check, it is safe so to do.

The relays A and B are connected to the output signals from the opto-electronic signaller 21 and the relay B is provided with a switch-in delay defined by the RC circuit 23 the function of which will be later explained. Relays C, D and G are energised directly from the power supply 18 on closure of the start switch 24. The start switch 24 is connected to a ganged contact 25 in the power supply 18 which simultaneously connects the power supply to the light transmitter 15 and the light receiver 16.

It will be noticed that the relay C is provided with a drop out delay defined by the RC circuit 26 and that the relay G has only a single make contact g1 which interrupts the earth connection to the opto-electronic signaller 21. The purpose of these features will be explained later.

It will be noted that various relay contacts of various ones of the relays are connected between the other relays and earth. The interconnection of these relay contacts, which ensures the desired cyclic testing of all relays, will now be described.

Relays A and B both have four relay contacts a1 to 4 and b1 to 4 and the contacts a1 and b1 are connected into the energising circuit for driving the press which will be later described in connection with FIGS. 2 and 3. Because of this, relays A and B are referred to as first and second main relays whereas relays C and D which principally have a monitoring function are referred to as first and second monitoring relays. The relays A and B are connected to earth via parallel arrangements of relay contacts a2, c3 and b2, c2 and are energised as previously described from the opto-electronic signaller 21 provided that the light barrier is unbroken, i.e. if no intervention is taking place. Such intervention can be either by hand or perhaps by the presence of a foreign object such as a spanner within the monitored region. Thus when the monitored region 17 is uninterrupted and the contacts in the energising circuits of the relays A and B are closed then the relays A and B are energised. If through intervention, for example by an object, the monitored region 17 is interrupted then the opto-electronic signaller 21 interrupts the supply of energising current to relays A and B.

Relay contacts a2 and b2 are self holding contacts of the relays A and B.

The first monitoring relay C which is likewise fed from the power supply 18 is connected to earth via the break contacts a4, b4 of the first and second main relays A and B and a further break contact d6 of the second monitoring relay D.

The second monitoring relay D is connected to earth via make contacts a3, b3 of the first and second main relays A and B and a make contact C 4 of the first monitoring relay C and also via a switch 27 actuated by the machine when it is in its upper inactive position. A self holding contact d4 of the second monitoring relay D is connected in parallel with the make contact c4.

Whilst relays A and B are referred to as first and second main relays because, as will be later explained, they actuate contacts in the drive control circuit of the machine, the relays C and D are referred to as first and second monitoring relays because their function is principally one of monitoring.

The further relay G is connected to earth via the switch 27 which is cyclically actuated by the machine. The make contact g1 of the further relay G is connected to the optoelectronic signaller 11. On opening of the switch 27 the further relay G drops out so that its contact g1 opens, in this way interruption of the monitored region 17 of the light barrier is simulated.

FIG. 3 schematically illustrates the electric circuit of the machine M which includes a make contact n of a relay N. The relay N is a part of the actual machine control circuit 28 which includes in series two make contacts l and k and a break contact p of relays K, L and P which can themselves be seen in FIG. 2. A break contact c1 of the first monitoring relay C, a make contact a5 of the first main relay A and a make contact d2 of the second monitoring relay D are located in series in the energising circuit of the relay K which is connected to the power supply.

A break contact c6 of the first monitoring relay C, a make contact b5 of the second main relay B and a make contact d3 of the second monitoring relay D are connected in series one after the other in the energising circuit of the relay L.

Finally a break contact d1 of the second monitoring relay D is connected in the energising circuit of the third relay P. Because of their function the relays K, L and P are referred to as interlocks.

FIG. 4 schematically illustrates a simple relay with compulsorily guided contacts 29 and 30. 29 is a break contact and 30 a make contact. Both contacts are mechanically connected together via a rigid connection 31 such that if the break contact 29 should fuse itself to its mating contact then the contact 30 cannot close under any circumstances. In reverse, should the contact 30 fuse with its mating contact then the break contact 29 can no longer close.

The operation of the safety circuit of the present teaching is as follows:

After the apparatus is switched on the relay C is first of all energised as only break contacts are located in its energising circuit. The energising circuit is closed via the break contacts a4, b4 and d6. As a consequence the make contacts c2 to c4 of the relay C are closed.

Should no obstacle be present in the monitored region 17 then the relay A can be energised via the contact c3 and the relay B via the contact c2. In order that the closure movement of the tool in the machine (initiation of tool movement) does not take place directly after the machine has been switched on the circuit including the second main relay B is provided with a switch-in delay schematically illustrated by the R-C circuit 23.

This arrangement satisfies the requirement that, when the light curtain or light barrier is switched on for the first time, initiation of the tool movement is not immediately allowed to take place. The light barrier or light curtain must first be tested by intervention in the protected region.

On switching on of the circuit the relay A will be energised immediately which will open the make contact a4 thus deenergising the relay C. The drop out delay of relay C is of the order of 50 milli-seconds so that contact c2 will have reopened before the delay circuit 23 could enable relay B to be energised. Contact a4 will remain open until the light barrier is interrupted as contact a2 is a self holding contact. The light barrier is now tested by intervention in the monitored region and interruption of the light barrier causes the deenergisation of relay A.

The delay applied to relay B is only operative when the machine is first switched on. This is achieved by way of a time switch 33 which short circuits the delay circuit 23 after the apparatus has first been switched on. Such time switches are well known per se and operate for example in response to the charging of a capacitor. The time delay prior to operation of the switch 33 is chosen to be approximately equal to the delay introduced by the RC circuit 23, i.e. about 15 seconds.

Contact a4 closes on deenergisation of relay A and relay C is once more energised so that contacts c2 and c3 close. As soon as the monitored region is no longer interrupted the optoelectronic signaller can energise both the relays A and B (this time without delay as the time switch 33 has short circuited the RC delay circuit 23).

As soon as the relays A and B have engaged, i.e. are energised, the break contacts a4 and b4 in the energising circuit of relay C open so that relay C is no longer energised. As however the relay C is provided with a drop out delay in well-known manner (necessary for the present teaching and illustrated by the RC circuit 26) it is ensured that the contacts c2, c3 and c4 only open when the contacts a2 and b2 are closed. The first and second main relays A and B are energised via the contacts a2 and b2. The contacts a3 and b3 are presently closed. The drop out delay of the relay C defined by the RC circuit 26 must be sufficiently large that at this moment the make contact c4 of the first monitoring relay C is closed. c4 must remain closed until d4 is closed, from this point on the relay D maintains itself engaged. On energising of the relays A, B and D the break contacts a4, b4 and d6 in the energising circuit of relay C open so that relay C is deenergised.

As the contacts c1, c6, b5 and d3 are now closed and the contact d1 is open the operation of the machine is allowed to take place and working movement of the machine, for example a press process, can begin either automatically or by switching it in by hand.

After the working cycle the machine remains in its upper deactivated position. Relays A, B and D are still energised relay C however not.

If now the operator intervenes in the monitored region 17 to introduce a new work piece into the machine then the signaller 21 interrupts the supply of current to the relays A and B. The consequence is that relay D is no longer energised because of the presently opened contacts a3, b3 and thus drops out. The further consequence is that the relay C is energised via the presently closed contacts a4, b4 and d6.

If now the operator removes his hands from the monitored region 17 then the cycle of contact changes begins once more as was described above in connection with switching on the machine with the exception of the artificially introduced switch in delay of the relay B.

As can be seen from the previous operational description during the functional testing cycles each relay adopts once the operating condition "de-energised" and once the operating condition "energised" Should one of the contacts remain stuck during this operational test then the further operation is interrupted and all the contacts in the operating drive circuit for the machine can no longer close.

For the case in which the machine is automatic, i.e. is not supplied by hand so that the monitored region 17 is not periodically interrupted then the switch 27 is provided which is actuated by the machine via a sensor 31. The switch 27 is normally closed however opens for a short time when the machine is in its upper position during the operating cycle. By opening of this switch the test cycle for all the relays is likewise initiated. On opening of the switch the energised relays D and G first drop out, i.e. are de-energised. The contact g1 now opens and simulates, via the signaller 21, the presence of an obstacle in the monitored region although no actual intervention in this region takes place. As a result the relays A and B drop out. The relay C can now engage, i.e. is energised, via the closed contacts a4, b4 and d6. After this automatic test the relays A, B and D can once more engage and the relay C can drop out. A further closing movement is now initiated. Thus in this case also each relay or relay contact is actuated once and thus tested during each test cycle.

The circuit of the present teaching provides a very high degree of safety as prior to each initiation of a working cycle the machine can recognize even a single seized contact. Should, during the next closure movement of the tool, a contact remain stuck on the entry of an obstacle into the monitored region, then the energising circuit for the relays K,L or P are nevertheless correspondingly influenced.

As an example it is assumed that the make contact d3 in the drive control circuit of the machine M is seized. This fault will be recognized by the next test cycle which is initiated by opening of the switch 27 or by intervention in the monitored region 17 as, following seizure of a make contact of the second monitoring relay D, all the break contacts of this relay remain open. In this case the break contact d6 is permanently open and relay C cannot be energised.

The consequence is that, amongst others, the contacts c2 and c3 remain open. The relays A and B can thus no longer be energised even if the monitored region 17 is free. None of the interlock relays K, L and P are energised and thus machine M cannot be set in operation.

It is important that at least the first and second main relays A and B and the first and second monitoring relays C and D are provided with compulsorily guided contacts. As, in the embodiment shown the other relays only have single contacts this is of course not applicable to them in the present example. However, should modifications be made requiring further contacts in any of these relays then it is beneficial if these are also compulsorily guided.

It will be appreciated that further modification may be made to the arrangement herein described without departing from the scope of the present teaching.

What is claimed is:

1. Safety circuit for a potentially dangerous machine monitored by light, especially a machine having a drive circuit and which operates in a cycle between a dangerous position and a non-dangerous position and which is made safe by a light barrier or light curtain against intervention, said safety circuit including a first main relay which is energized when the region being monitored is free and which has a make contact located in the drive circuit of the machine, said safety circuit also comprising:

(a) a second main relay connected in parallel with the first main relay, (b) a first monitoring relay connected in series with break contacts of the first and second main relays and of a second monitoring relay, the first monitoring relay having drop out delay means and two make contacts respectively connected in series with respective ones of the first and second main relays, (c) the make contacts of the first and second main relays and the first monitoring relay being connected in series with the second monitoring relay, and a self holding contact of the second monitoring relay being connected in parallel with the make contact of the first monitoring relay, (d) self holding contacts of the two main relays being respectively connected in parallel with the make contacts of the first monitoring relay which are in series with the first and second main relays, (e) at least one break contact of the first monitoring relay and a make contact of the second monitoring relay being connected in series in the drive circuit for the machine and (f) all relays having compulsorily guided contacts.

2. A safety circuit according to claim 1 wherein apart from the make contact which is located in the drive circuit of the machine and which belongs to the first main relay, a second make contact of the second main relay is also connected in series in the drive circuit of the machine.

3. A safety circuit according to either of claims 1 or 2 wherein a contact of a further relay is inserted between the first and second main relays and an opto-electronic signaller device which actuates the main relays, there being a switch in the energizing circuit for the further relay which is also connected in series with the second monitoring relay and which is open when the machine is in a non-dangerous position but is otherwise closed.

4. A safety circuit according to claim 1, wherein the relay contacts arranged in the driving circuit of the machine lie in series in the current circuit of interlocks the make contacts of which lie in the control circuit for the machine.

5. A safety circuit according to claim 4 wherein the make contacts of the two interlocks are connected in series in the control circuit of the machine and wherein a break control of the first monitoring relay and a make contact of the second monitoring relay and a make contact of the first main relay and of the second main relay are respectively connected in series in the current circuits of the two interlocks.

6. A safety circuit according to either of claims 4 or 5 wherein in addition, a break contact of a second additional relay is arranged in series in the machine control circuit, with a break contact of the second monitoring relay arranged in the energizing circuit for the second additional relay.

7. Safety circuit for a potentially dangerous machine monitored by light, especially a machine having a drive circuit and which operates in a cycle between a dangerous position and a non-dangerous position and which is made safe by a light barrier or light curtain against intervention, said safety circuit including a first main relay which is energized when the region being monitored is free and which has a make contact located in the drive circuit of the machine, said safety circuit comprising a test circuit including a series of further relays, each having a plurality of compulsorily guided contacts at least one of each of which is disposed in the energizing circuit of at least one of the other relays whereby, during one working cycle of the machine, each relay is switched at least once from an energized to a de-energized condition whereby all relay contacts are switched in sequence at least once from an open to a closed position and wherein the interconnection of the relay contacts prevents a further cycle of machine operation if said sequence is interrupted due to one of the following causes:

(a) any relay contact sticking and (b) untimely intervention in the monitoring light barrier.

* * * * *